US010992259B2

(12) United States Patent
Zhang et al.

(10) Patent No.: US 10,992,259 B2
(45) Date of Patent: Apr. 27, 2021

(54) OSCILLATOR

(71) Applicant: Shanghai Huali Microelectronics Corporation, Shanghai (CN)

(72) Inventors: Ning Zhang, Shanghai (CN); Xuanli Zhu, Shanghai (CN); Zhili Wang, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 16/815,379

(22) Filed: Mar. 11, 2020

(65) Prior Publication Data

US 2021/0058031 A1 Feb. 25, 2021

(30) Foreign Application Priority Data

Aug. 22, 2019 (CN) .......................... 201910777059.4

(51) Int. Cl.
*H03B 5/04* (2006.01)
*H03B 5/24* (2006.01)
(52) U.S. Cl.
CPC .................. *H03B 5/04* (2013.01); *H03B 5/24* (2013.01)
(58) Field of Classification Search
CPC ....................................................... H03B 5/04
USPC .......................................................... 331/66
See application file for complete search history.

(56) References Cited

U.S. PATENT DOCUMENTS

| 2016/0049905 | A1* | 2/2016 | Lesbats | ..................... H03L 1/00 331/66 |
| 2017/0255220 | A1* | 9/2017 | Sivakumar | ............. H03K 3/011 |
| 2018/0138866 | A1* | 5/2018 | Liang | ............... H03K 3/356182 |
| 2020/0286574 | A1* | 9/2020 | Kunz | ............... G01R 19/16552 |

* cited by examiner

*Primary Examiner* — Joseph Chang
(74) *Attorney, Agent, or Firm* — Banner & Witcoff, Ltd.

(57) ABSTRACT

An oscillator comprising an RC oscillator and a bandgap reference source, wherein the bandgap reference source provides a reference current for the RC oscillator, and a temperature coefficient of the reference current is adjustable. Since the oscillation frequency of the RC oscillator has less dependency on a power supply, a clock source having a relatively precise frequency thus can be obtained; and based on the RC oscillator, the bandgap reference source having a temperature compensation function is added, the reference current generated by the bandgap reference source with an adjustable temperature coefficient is used for temperature coefficient compensation to the inherent temperature coefficient of the oscillation frequency of the RC oscillator, thereby reducing the effect of the temperature on the oscillator, so that the output frequency of the oscillator does not change with the temperature as far as possible, which improves the oscillation frequency precision of the oscillator.

10 Claims, 4 Drawing Sheets

OSCILLATOR

CROSS REFERENCE TO RELATED APPLICATIONS

The present application claims priority to and the benefit of Chinese Patent Application No. 201910777059.4 filed on Aug. 22, 2019, the disclosure of which is incorporated herein by reference in its entirety as part of the present application.

BACKGROUND

The invention relates to integrated circuit design, in particular to an oscillator.

A common RC oscillator circuit, which has a current steering structure, is shown in FIG. 1. In a half cycle, a delay is caused by charge and discharge of a capacitor using a unilateral current. Since the outputs Q and QB of an RS latch are inverted signals, it can ensure that the left and right switches (PM3, PM4, NM1, NM2) do not turn off at the same time, avoid the non-ideal effect of switching capacitor such as charge injection, which causes an R-controlled voltage VCR or S-controlled voltage VCS to jump. Due to use of an RS flip-flop with logic gate control, charge and discharge times of the two loops are basically the same, thereby ensuring the duty ratio of an output signal. The delay is mainly caused by the charge and discharge of the capacitor using the current, so an oscillation frequency has a direct relationship with the current and the capacitor and little relationship with the power supply voltage VDD. Because the V-I property of a semiconductor device is sensitive to the temperature, the oscillator frequency is greatly affected by the temperature. The oscillation frequency precision of the common RC oscillator circuit is mainly limited by the temperature drift of a CMOS device.

Although the common RCOSC (RC oscillator) circuit is basically independent of the power supply, the frequency precision is still affected by other external factors, such as the temperature and process.

BRIEF SUMMARY

The technical issue to be settled by the invention is to provide an oscillator having a high oscillation frequency precision.

To settle the above technical issue, the invention provides an oscillator comprising an RC oscillator 10 and a bandgap reference source 30, wherein:

the bandgap reference source 30 provides a reference current IREF for the RC oscillator 10; and a temperature coefficient of the reference current output by the bandgap reference source 30 is adjustable.

Preferably, the RC oscillator 10 and the bandgap reference source 30 are on the same substrate.

Preferably, the temperature coefficient of the reference current output by the bandgap reference source 30 is opposite to a temperature coefficient of an oscillation frequency output by the RC oscillator 10.

Preferably, both the RC oscillator 10 and the bandgap reference source 30 are semiconductor devices manufactured by mean of a CMOS process.

Preferably, the bandgap reference source 30 comprises an operational amplifier OPAMP, a first PMOS transistor M1, a second PMOS transistor M2, a third PMOS transistor M3, a first PNP transistor Q1, a second PNP transistor Q2, a first resistor R1, a second resistor R2, and a third resistor R3;

the resistances of the first resistor R1 and the second resistor R2 are adjustable;

an output of the operational amplifier OPAMP is connected to gates of the first PMOS transistor M1, the second PMOS transistor M2, and the third PMOS transistor M3;

source terminals of the first PMOS transistor M1, the second PMOS transistor M2, and the third PMOS transistor M3 are connected to a working voltage VDD;

a drain terminal of the first PMOS transistor M1 and an emitter of the first PNP transistor Q1 are connected to a positive input end of the operational amplifier OPAMP;

the first resistor R1 is connected between the positive input end of the operational amplifier OPAMP and the ground;

a drain terminal of the second PMOS transistor M2 is connected to a negative input end of the operational amplifier OPAMP;

the third resistor R3 is connected between the negative input end of the operational amplifier OPAMP and an emitter of the second PNP transistor Q2;

the second resistor R2 is connected between the negative input end of the operational amplifier OPAMP and the ground;

a base and a collector of the first PNP transistor Q1 and a base and a collector of the second PNP transistor Q2 are all grounded; and a drain terminal of the third PMOS transistor M3 outputs the reference current IREF.

Preferably, the first resistor R1 comprises N resistors and N−1 switches, N is an integer greater than or equal to 2, the N resistors are connected in series between the emitter of the first PNP transistor Q1 and the ground, and a switch is connected between a series connection point of two adjacent resistors and the ground; and the second resistor R2 comprises M resistors and M−1 switches, M is an integer greater than or equal to 2, the M resistors are connected in series between the emitter of the first PNP transistor Q1 and the ground, and a switch is connected between a series connection point of two adjacent resistors and the ground.

$$\frac{\Delta VBE}{R3} + \frac{VBE}{R1}$$

Preferably, the temperature coefficient of is opposite to the temperature coefficient of the oscillation frequency output by the RC oscillator 10, VBE is a voltage of the positive input end of the operational amplifier OPAMP to ground, ΔVBE is a voltage between the two ends of the third resistor R3, R1 is the resistance of the first resistor, and R3 is the resistance of the third resistor.

Preferably, the oscillator further comprises a low dropout linear regulator 20; and the low dropout linear regulator 20 provides a working voltage source for the RC oscillator 10 and the bandgap reference source 30.

Preferably, the bandgap reference source 30 further provides the reference current IREF and a reference voltage VREF for the low dropout linear regulator 20.

Preferably, the oscillator further comprises a digital frequency comparator 40;

a first input end of the digital frequency comparator 40 is connected to a reference clock, a second input end is connected to an oscillation output of the RC oscillator 10, a first output end outputs an eight-bit calibration code to a current trimming module of the RC oscillator 10, and a second output end is an indication signal output end;

in a self-calibration mode, the digital frequency comparator 40 performs counting for the oscillation output of the RC oscillator 10 on the basis of 10 cycles of the reference clock, in the 10 cycles of the reference clock, if the counting of the oscillation output of the RC oscillator is greater than 160 beats, the eight-bit calibration code is down-regulated by means of a binary tree algorithm, or if the counting of the oscillation output of the RC oscillator 10 is less than 160 beats, the eight-digit calibration code is up-regulated until the counting of the oscillation output of the RC oscillator 10 is equal to 160 beats, in which case an indication signal is output;

when the second output end of the digital frequency comparator 40 outputs the indication signal, the first output end thereof outputs the eight-bit calibration code to the current trimming module of the RC oscillator 10; and the current trimming module of the RC oscillator adjusts the oscillation output of the RC oscillator according to the eight-bit calibration code.

Preferably, the digital frequency comparator 40 is further provided with an enable signal input end; and the digital frequency comparator 40 enables or disables the self-calibration mode when an enable signal that accesses the enable signal input end presents a positive edge or a negative edge.

In the oscillator of the present invention, the RC oscillator 10 is selected as a frequency generating module, and since the oscillation frequency of the RC oscillator 10 has less dependency on a power supply, a clock source having a relatively precise frequency thus can be obtained; and based on the RC oscillator 10, the bandgap reference source 30 having a temperature compensation function is added, the reference current IREF generated by the bandgap reference source 30 with an adjustable temperature coefficient is used for temperature coefficient compensation to the inherent temperature coefficient of the oscillation frequency of the RC oscillator 10, thereby reducing the effect of the temperature on the oscillator, so that the output frequency of the oscillator does not change with the temperature as far as possible, which improves the oscillation frequency precision of the oscillator.

BRIEF DESCRIPTION OF THE DRAWINGS

In order to more clearly describe the technical solutions of the present invention, the drawings required by the present invention will be briefly described below. It is obvious that the drawings in the following description are merely some embodiments of the present invention, and those skilled in the art can obtain other drawings based on these drawings without any creative work.

DETAILED DESCRIPTION

The technical solutions of the present invention are clearly and completely described below with reference to the drawings. It is obvious that the described embodiments are merely some of the embodiments of the present invention, rather than all of the embodiments. All other embodiments obtained by those skilled in the art based on the embodiments of the present invention without creative work fall within the protection scope of the present invention.

Embodiment 1

Figure 1:
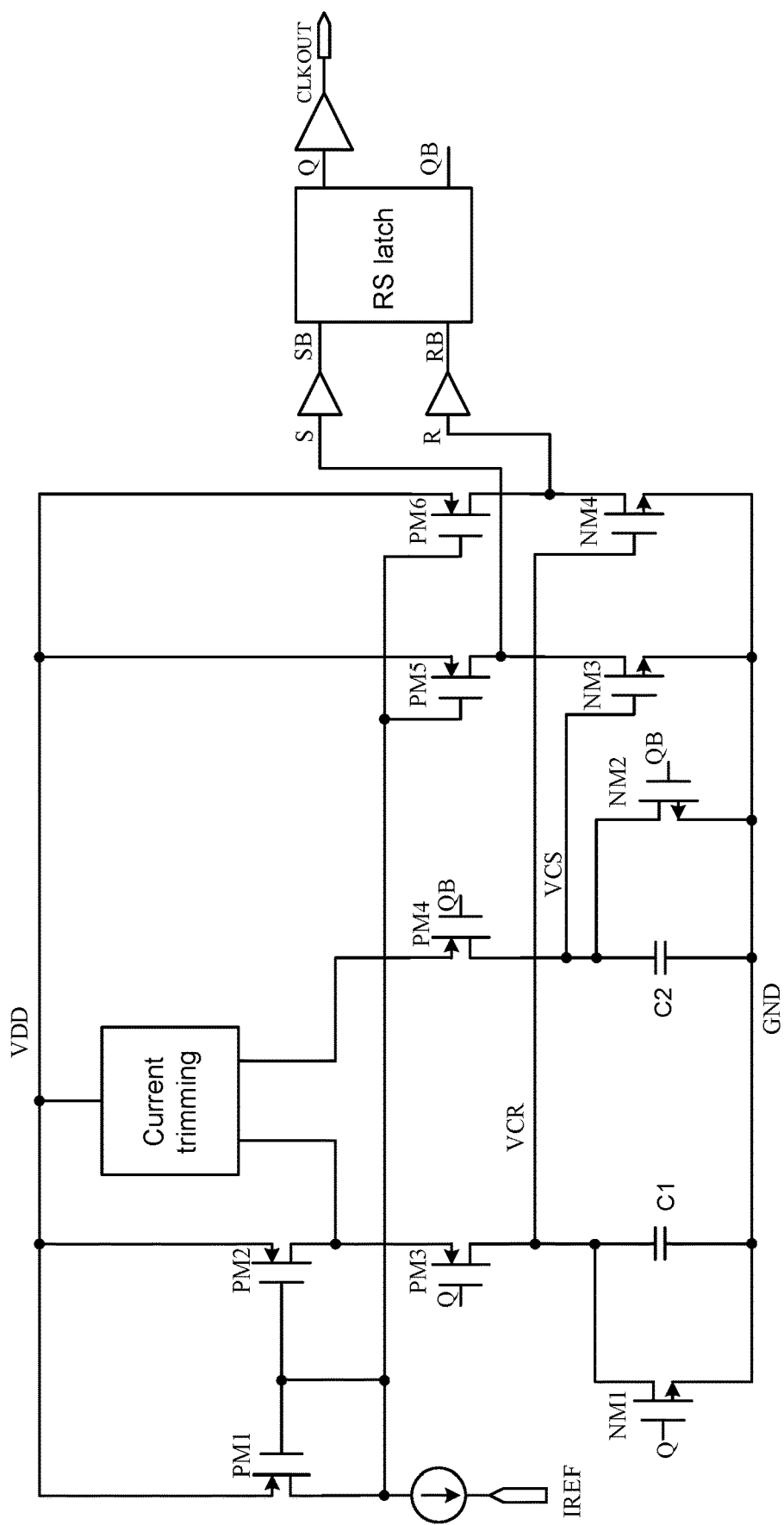
FIG. 1 is a circuit diagram of a common RC oscillator circuit.
Figure 2:
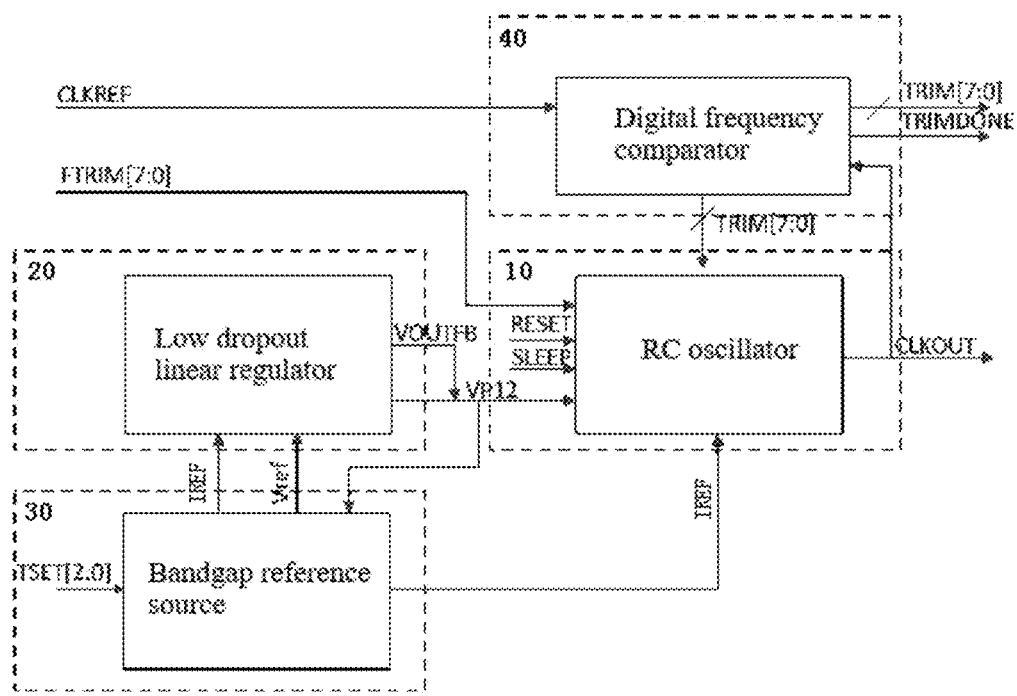
FIG. 2 is a circuit structure block diagram in an embodiment of an oscillator of the present invention.

As shown in FIG. 2, an oscillator comprises an RC oscillator 10 and a bandgap reference source 30.

The bandgap reference source 30 provides a reference current IREF for the RC oscillator 10.

A temperature coefficient of the reference current output by the bandgap reference source 30 is adjustable.

Preferably, the temperature coefficient of the reference current output by the bandgap reference source 30 is opposite to a temperature coefficient of an oscillation frequency output by the RC oscillator 10.

Preferably, both the RC oscillator 10 and the bandgap reference source 30 are semiconductor devices manufactured by mean of a CMOS process.

Preferably, the RC oscillator 10 and the bandgap reference source 30 are on the same substrate.

In the oscillator of embodiment 1, the RC oscillator 10 is selected as a frequency generating module, and since the oscillation frequency of the RC oscillator 10 has less dependency on a power supply, a clock source having a relatively precise frequency thus can be obtained; and based on the RC oscillator 10, the bandgap reference source 30 having a temperature compensation function is added, the reference current IREF generated by the bandgap reference source 30 with an adjustable temperature coefficient is used for temperature coefficient compensation to the inherent temperature coefficient of the oscillation frequency of the RC oscillator 10, thereby reducing the effect of the temperature on the oscillator, so that the output frequency of the oscillator does not change with the temperature as far as possible, which improves the oscillation frequency precision of the oscillator.

Embodiment 2

Figure 3:
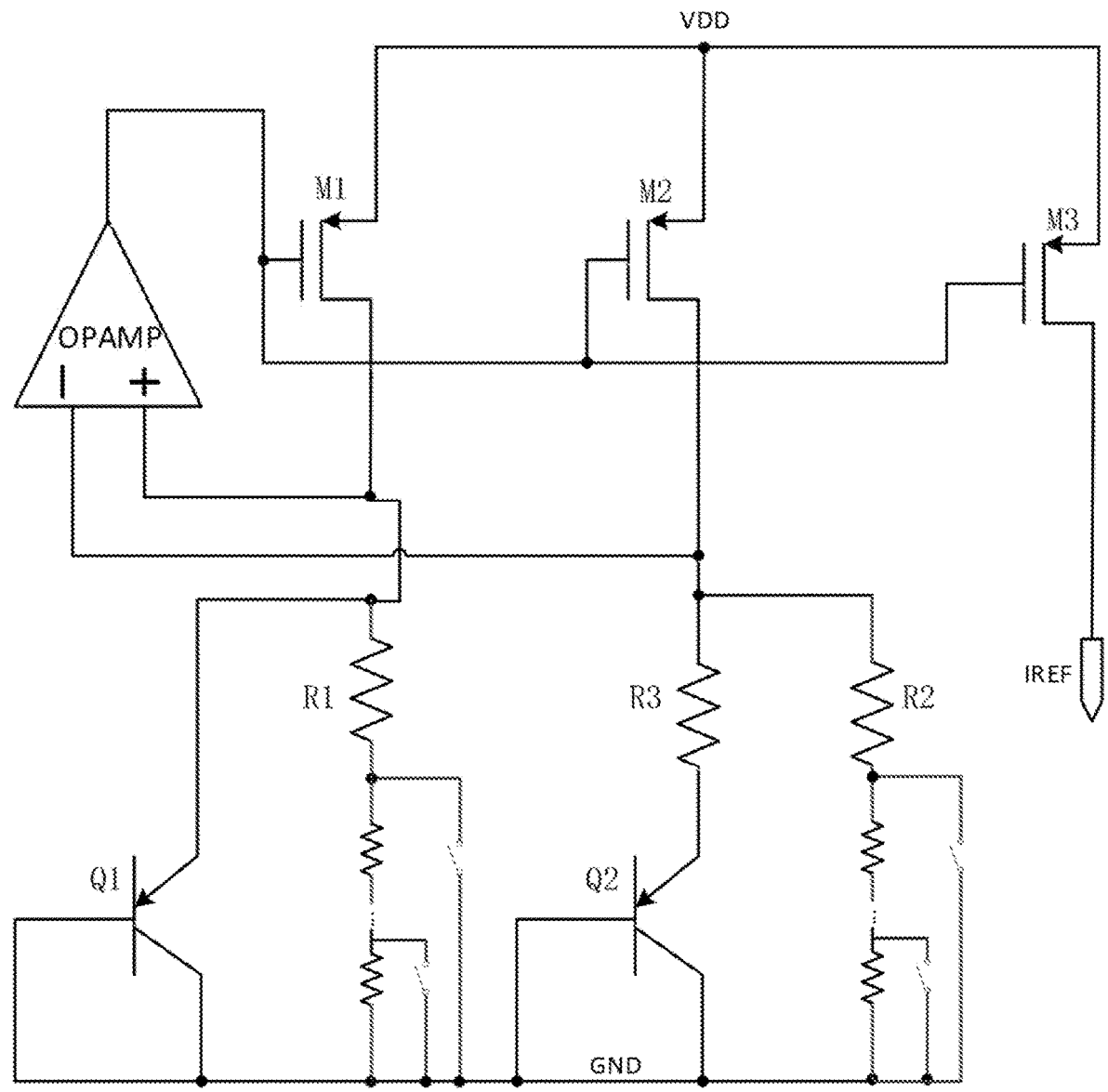
FIG. 3 is a circuit diagram of a bandgap reference source in an embodiment of the oscillator of the present invention.

Based on the oscillator of embodiment 1, as shown in FIG. 3, the bandgap reference source 30 comprises an operational amplifier OPAMP, a first PMOS transistor M1, a second PMOS transistor M2, a third PMOS transistor M3, a first PNP transistor Q1, a second PNP transistor Q2, a first resistor R1, a second resistor R2, and a third resistor R3.

The resistances of the first resistor R1 and the second resistor R2 are adjustable.

An output of the operational amplifier OPAMP is connected to gates of the first PMOS transistor M1, the second PMOS transistor M2, and the third PMOS transistor M3.

Source terminals of the first PMOS transistor M1, the second PMOS transistor M2, and the third PMOS transistor M3 are connected to a working voltage VDD.

A drain terminal of the first PMOS transistor M1 and an emitter of the first PNP transistor Q1 are connected to a positive input end of the operational amplifier OPAMP.

The first resistor R1 is connected between the positive input end of the operational amplifier OPAMP and the ground.

A drain terminal of the second PMOS transistor M2 is connected to a negative input end of the operational amplifier OPAMP.

The third resistor R3 is connected between the negative input end of the operational amplifier OPAMP and an emitter of the second PNP transistor Q2.

The second resistor R2 is connected between the negative input end of the operational amplifier OPAMP and the ground.

A base and a collector of the first PNP transistor Q1 and a base and a collector of the second PNP transistor Q2 are all grounded.

A drain terminal of the third PMOS transistor M3 outputs the reference current IREF.

Preferably, as shown in FIG. 3, the first resistor R1 comprises N resistors and N−1 switches, N is an integer greater than or equal to 2, the N resistors are connected in series between the emitter of the first PNP transistor Q1 and the ground, and a switch is connected between a series connection point of two adjacent resistors and the ground.

As shown in FIG. 3, the second resistor R2 comprises M resistors and M−1 switches, M is an integer greater than or equal to 2, the M resistors are connected in series between the emitter of the first PNP transistor Q1 and the ground, and a switch is connected between a series connection point of two adjacent resistors and the ground.

Preferably, the temperature coefficient of $$\frac{\Delta VBE}{R3} + \frac{VBE}{R1}$$

is opposite to the temperature coefficient of the oscillation frequency of the RC oscillator 10, VBE is a voltage of the positive input end of the operational amplifier OPAMP to ground, ΔVBE is a voltage between the two ends of the third resistor R3, R1 is the resistance of the first resistor, and R3 is the resistance of the third resistor.

In the oscillator of embodiment 2, the ratio between the resistances of the first resistor R1 and the second resistor R2 are adjusted such that the sum of a positive temperature coefficient (PTAT)

$$\frac{\Delta VBE}{R3}$$

and a complementary temperature coefficient (CTAT)

$$\frac{VBE}{R1}$$

thereof is opposite to the temperature coefficient of the oscillation frequency of the RC oscillator 10, enabling the bandgap reference source 30 to have a temperature compensation function for temperature coefficient compensation, thereby reducing the effect of the temperature on the oscillator, so that the output frequency of the oscillator does not change with the temperature as far as possible, which improves the oscillation frequency precision of the oscillator.

Embodiment 3

Based on embodiment 1, the oscillator further comprises a low dropout linear regulator 20.

The low dropout linear regulator 20 provides a working voltage source for the RC oscillator 10 and the bandgap reference source 30.

Preferably, the bandgap reference source 30 further provides the reference current IREF and a reference voltage VREF for the low dropout linear regulator 20.

The low dropout linear regulator (LDO) is a micro-power low dropout linear regulator that generally has extremely low self-noise and a relatively high power supply rejection ratio (PSRR). The low dropout linear regulator is a new generation of an integrated circuit regulator and differs from a three terminal regulator mainly in that the low dropout linear regulator is a system on chip (SOC) with very low self-consumption, which can be used for controlling a main channel of a current, with the chip being integrated with a MOSFET with extremely low on-resistance and hardware circuits such as a Schottky diode, a sampling resistor, and a divider resistor, and the system having functions such as overcurrent protection, over-temperature protection, a precise reference source, a differential amplifier, and a delayer.

In the oscillator of embodiment 3, the low dropout linear regulator 20 is adopted to provide a stable voltage source for the RC oscillator 10, thereby reducing the effect of power supply noise on the oscillation frequency of the RC oscillator 10.

Embodiment 4

Based on embodiment 1, the oscillator further comprises a digital frequency comparator 40.

A first input end of the digital frequency comparator 40 is connected to a reference clock CLKREF, a second input end is connected to an oscillation output CLKOUT of the RC oscillator 10, a first output end outputs an eight-bit calibration code trim[7:0] to a current trimming module of the RC oscillator 10, and a second output end is an indication signal TRIMDONE output end.

In a self-calibration mode, the digital frequency comparator 40 performs counting for the oscillation output CLKOUT of the RC oscillator 10 on the basis of 10 cycles of the reference clock CLKREF, in the 10 cycles of the reference clock CLKREF, if the counting of the oscillation output CLKOUT of the RC oscillator 10 is greater than 160 beats, the eight-bit calibration code trim[7:0] is down-regulated by means of a binary tree algorithm, or if the counting of the oscillation output CLKOUT of the RC oscillator 10 is less than 160 beats, the eight-digit calibration code trim[7:0] is up-regulated until the counting of the oscillation output CLKOUT of the RC oscillator 10 is equal to 160 beats, in which case an indication signal TRIMDONE is output (for example, a high level is output).

When the second output end of the digital frequency comparator 40 outputs the indication signal TRIMDONE, the first output end thereof outputs the eight-bit calibration code trim[7:0] to the current trimming module of the RC oscillator 10.

The current trimming module of the RC oscillator adjusts the oscillation output CLKOUT of the RC oscillator according to the eight-bit calibration code trim[7:0].

Preferably, the digital frequency comparator 40 is further provided with an enable signal input end.

The digital frequency comparator 40 enables or disables the self-calibration mode when an enable signal that accesses the enable signal input end presents a positive edge or a negative edge.

In the oscillator of embodiment 4, after the oscillator is powered on and the digital frequency comparator 40 is enabled, the digital frequency comparator 40 can perform automatic calibration to a target frequency (the eight-bit calibration code trim[7:0]) in a corresponding specific range according to the frequency of the reference clock CLKREF, the current trimming module of the RC oscillator 10 automatically adjusts the oscillation output CLKOUT of the RC oscillator according to the target frequency (the eight-bit calibration code trim[7:0]), without an external manual trimming function, thereby saving test machine and time.

Figure 4:
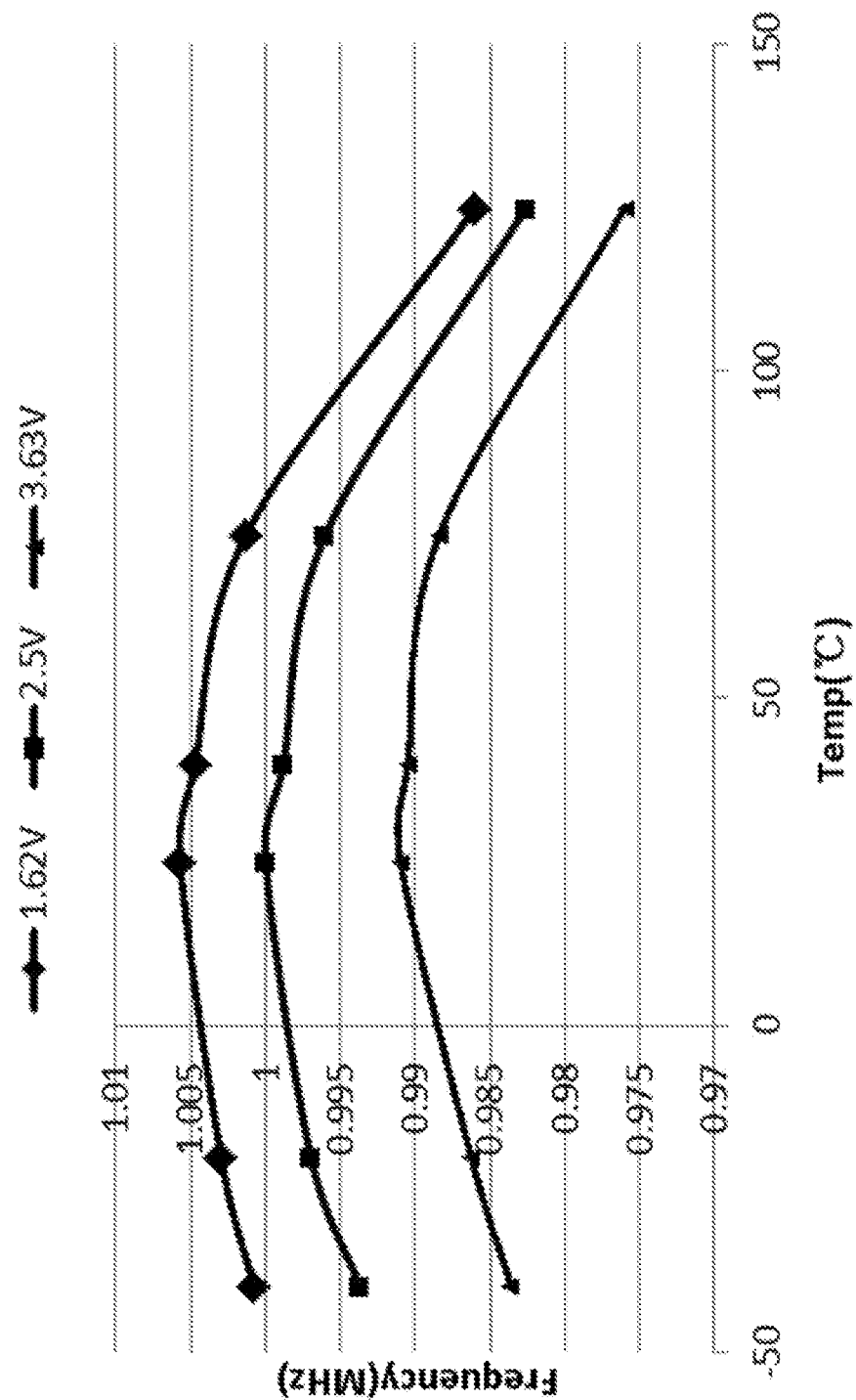
FIG. 4 is a curve of a full-temperature/full-voltage frequency test in an embodiment of the oscillator of the present invention.

The oscillator of the present invention adopts techniques such as self-adaptive calibration, temperature compensation, and a non-capacitance low dropout regulator, can generate a clock signal with a precision of ±0.25% at room temperature and ±1.2% at high and low temperature, and supports generation of a 16 MHz high-precision clock with a wide power domain. A 16 MHz oscillator of the 55 Embedded Flash platform is silicon-prove, and outputs of the 16 MHz oscillator subject to frequency division to 1 MHz are shown in FIG. 4, wherein a test precision at full temperature (−40° C.-125° C.) and three voltages (1.62 V, 2.5 V, and 3.63 V) is less than plus or minus 1.2%. In a temperature drift curve of the same voltage, a high temperature deviation is −1.7%, and a low temperature deviation is −0.6%, presenting a parabola, which verifies that a linear portion of the temperature drift of the output frequency of the oscillator is compensated, while frequency drifts at different voltages are limited to a controllable magnitude.

The above are merely preferred embodiments of the present application and are not intended to limit the present application. Various changes and modifications can be made to the present application by those skilled in the art. Any modifications, equivalent substitutions, improvements, etc. made within the spirit and principle of the present application shall fall within the protection scope of the present application.

What is claimed is:

1. An oscillator, comprising an RC oscillator and a bandgap reference source, wherein:
the bandgap reference source provides a reference current for the RC oscillator; and
a temperature coefficient of the reference current provided by the bandgap reference source is adjustable;
the bandgap reference source comprises an operational amplifier, a first PMOS transistor, a second PMOS transistor, a third PMOS transistor, a first PNP transistor, a second PNP transistor, a first resistor, a second resistor, and a third resistor;
resistances of the first resistor and the second resistor are adjustable;
an output of the operational amplifier is connected to gates of the first PMOS transistor, the second PMOS transistor, and the third PMOS transistor;
source terminals of the first PMOS transistor, the second PMOS transistor, and the third PMOS transistor are connected to a working voltage;
a drain terminal of the first PMOS transistor and an emitter of the first PNP transistor are connected to a positive input end of the operational amplifier;
the first resistor is connected between the positive input end of the operational amplifier and a ground,
a drain terminal of the second PMOS transistor is connected to a negative input end of the operational amplifier;
the third resistor is connected between the negative input end of the operational amplifier and an emitter of the second PNP transistor;

the second resistor is connected between the negative input end of the operational amplifier and the ground;
a base and a collector of the first PNP transistor and a base and a collector of the second PNP transistor are all grounded; and
a drain terminal of the third PMOS transistor outputs the reference current.

2. The oscillator according to claim 1, wherein:
the RC oscillator and the bandgap reference source are on the same substrate.

3. The oscillator according to claim 1, wherein:
the temperature coefficient of the reference current provided by the bandgap reference source is opposite to a temperature coefficient of an oscillation frequency output by the RC oscillator.

4. The oscillator according to claim 1, wherein:
both the RC oscillator and the bandgap reference source are semiconductor devices manufactured by means of a CMOS process.

5. The oscillator according to claim 1, wherein:
the first resistor comprises N resistors and N−1 switches, N is an integer greater than or equal to 2, the N resistors are connected in series between the emitter of the first PNP transistor and the ground, and a switch is connected between a series connection point of two adjacent resistors and the ground; and
the second resistor comprises M resistors and M−1 switches, M is an integer greater than or equal to 2, the M resistors are connected in series between the emitter of the second PNP transistor and the ground, and a switch is connected between a series connection point of two adjacent resistors and the ground.

6. The oscillator according to claim 1, wherein:
a temperature coefficient of $$\frac{\Delta VBE}{R3} + \frac{VBE}{R1}$$

is opposite to a temperature coefficient of an oscillation frequency output by the RC oscillator, VBE is a voltage of the positive input end of the operational amplifier to the ground, ΔVBE is a voltage between the two ends of the third resistor, R1 is the resistance of the first resistor, and R3 is the resistance of the third resistor.

7. The oscillator according to claim 1, wherein:
the oscillator further comprises a low dropout linear regulator; and
the low dropout linear regulator provides a working voltage source for the RC oscillator and the bandgap reference source.

8. The oscillator according to claim 7, wherein:
the bandgap reference source further provides the reference current and a reference voltage for the low dropout linear regulator.

9. An oscillator, comprising an RC oscillator and a bandgap reference source, wherein:
the bandgap reference source provides a reference current for the RC oscillator; and
a temperature coefficient of the reference current provided by the bandgap reference source is adjustable, wherein:
the oscillator further comprises a digital frequency comparator;
a first input end of the digital frequency comparator is connected to a reference clock, a second input end is connected to an oscillation output of the RC oscillator, a first output end outputs an eight-bit calibration code to a current trimming module of the RC oscillator, and a second output end is an indication signal output end;

in a self-calibration mode, the digital frequency comparator performs counting for the oscillation output of the RC oscillator on the basis of 10 cycles of the reference clock, in the 10 cycles of the reference clock, if the counting of the oscillation output of the RC oscillator is greater than 160 beats, the eight-bit calibration code is down-regulated by means of a binary tree algorithm, or if the counting of the oscillation output of the RC oscillator is less than 160 beats, the eight-bit calibration code is up-regulated until the counting of the oscillation output of the RC oscillator is equal to 160 beats, in which case an indication signal is output;

when the second output end of the digital frequency comparator outputs the indication signal, the first output end thereof outputs the eight-bit calibration code to the current trimming module of the RC oscillator; and the current trimming module of the RC oscillator adjusts the oscillation output of the RC oscillator according to the eight-bit calibration code.

10. The oscillator according to claim 9, wherein:

the digital frequency comparator is further provided with an enable signal input end; and the digital frequency comparator enables or disables the self-calibration mode when an enable signal that accesses the enable signal input end presents a positive edge or a negative edge.

* * * * *